(12) United States Patent
Shinohara (10) Patent No.: US 8,335,120 B2
(45) Date of Patent: Dec. 18, 2012

(54) SEMICONDUCTOR MEMORY CIRCUIT AND CONTROL METHOD FOR READING DATA

(75) Inventor: Kensuke Shinohara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 62 days.

(21) Appl. No.: 12/685,854

(22) Filed: Jan. 12, 2010

(65) Prior Publication Data

US 2010/0188912 A1 Jul. 29, 2010

(30) Foreign Application Priority Data

Jan. 26, 2009 (JP) .................. 2009-014755

(51) Int. Cl.
*G11C 7/00* (2006.01)
(52) U.S. Cl. .............. 365/203; 365/189.11; 365/154
(58) Field of Classification Search ............. 365/154, 365/72, 190, 156, 203, 189.15, 189.16, 189.09, 365/189.08, 189.1, 1, 230.06, 189.11, 185.25, 365/185.18
See application file for complete search history.

(56) References Cited

U.S. PATENT DOCUMENTS

| | | | |
|---|---|---|---|
| 7,352,650 B2 | 4/2008 | Yokoyama | |
| 7,499,312 B2 * | 3/2009 | Matick et al. | ............ 365/154 |
| 7,839,704 B2 * | 11/2010 | Murata | ............ 365/189.16 |
| 2006/0262628 A1 * | 11/2006 | Nii et al. | ............ 365/226 |
| 2008/0165562 A1 | 7/2008 | Matick et al. | |

FOREIGN PATENT DOCUMENTS

JP 2006-331568 12/2006

OTHER PUBLICATIONS

J. Davis, et al., "A 5.6GHz 64kB Dual-Read Data Cache for the POWER6™ Processor", 2006 IEEE International Solid-State Circuits Conference, 2006.
K. Zhang, et al., "The Scaling of Data Sensing Schemes for High-Speed Cache Design in Sub-0.18 μm Technologies," 2000 Symposium on VLSI Circuits Digest of Technical Papers, pp. 226-227, 2000.
European Search Report dated Nov. 12, 2010 for corresponding European Patent Application No. 10 151 066.7.

* cited by examiner

*Primary Examiner* — Karetelia Graham
(74) *Attorney, Agent, or Firm* — Staas & Halsey LLP (57) ABSTRACT

A semiconductor memory device includes a first memory circuits connecting to a first bit line, a second bit line and a word line, a first pre-charge control circuit connecting to a first pre-charge control line, the first bit line and the second bit line and that pre-charges the first bit line and the second bit line on the basis of the input from the first pre-charge control line, and a read control circuit having a first transistor, a second transistor, a third transistor and a fourth transistor, wherein the fourth transistor is brought into conduction on the basis of the input from a charged global-bit-line driver control line, the column having the first bit line and the second bit line is thus selected, and the information held in the memory circuit connecting to the driven word line among the memory circuits is output to the third bit line.

7 Claims, 8 Drawing Sheets

RELATED ART

FIG. 7

A-1 AND A-2: LOCAL BIT LINES 71
B: GLOBAL BIT LINE 111
C-1 AND C-2: INVERTERS 205

RELATED ART

FIG. 8

{ (B) LOCAL BIT LINE 71
{ (C) GLOBAL BIT LINE 111

RELATED ART

SEMICONDUCTOR MEMORY CIRCUIT AND CONTROL METHOD FOR READING DATA

CROSS REFERENCE TO RELATED APPLICATION

This application is based upon and claims the benefit of priority from the prior Japanese Patent Application NO. 2009-014755 filed on Jan. 26, 2009, the entire contents of which are incorporated herein by reference.

FIELD

The embodiment discussed herein are related to semiconductor memory circuit and control method for reading data.

BACKGROUND

Hitherto, in order to store various data in a semiconductor integrated circuit, a semiconductor memory circuit such as an SRAM (static random access memory) and a DRAM (dynamic random access memory) have been used.
[Patent Document 1] Japanese Laid-open Patent Publication No. 2006-331568
[Non patent Document 1] Kevin Zhang, Ken Hose, Vivek De, and Borys Senyk "*The Scaling of Data Sensing Schemes for High Speed Cache Design in Sub*-0.18 μm *Technologies*" Symposium on VLS1 Circuits Digest of Technical Papers, PP 226-227, 2000.
[Non patent Document 2] J. Davis, D. Plass, P. Bunce, Y. Chan, A. Pelella, R. Joshi, A. Chen, W. Huott, T. Knips, P. Patel, K. Lo, and E. Fluhr "*A* 5.6 *GHz* 64 *kB Dual-Read Data Cache for the POWER*6 *Processor*" IEEE International Solid-State Circuits Conference, 2006.

The semiconductor memory circuit has adopted a dynamic circuit in which a single p-type MOS transistor connects to a single bit line. The adoption of the dynamic circuit may reduce the load capacity of the bit line more than a static circuit because only one transistor connects to the bit line and thus may increase the operation speed. Also, since the dynamic circuit may be configured by a lower number of transistors, which may reduce the circuit area.

Figure 6A:
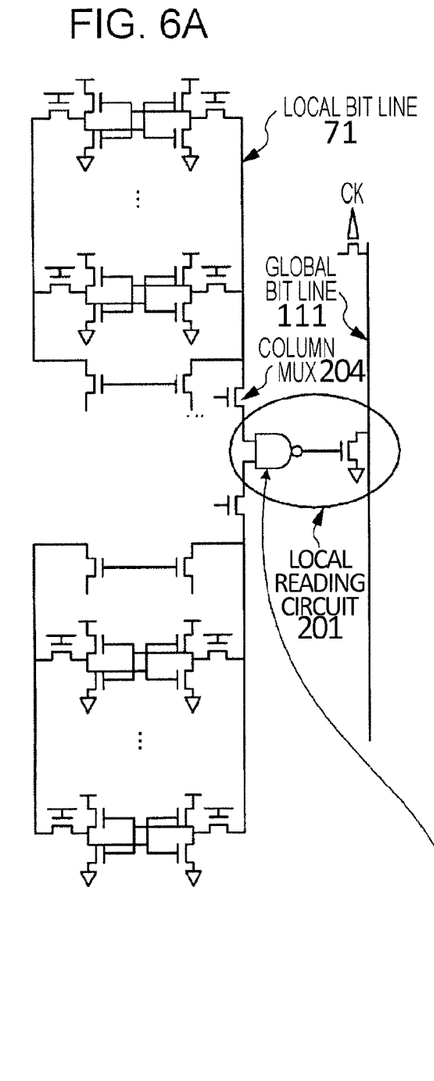
FIGS. 6A and 6B are diagrams of circuit configurations in the past.

The semiconductor memory circuit in the past having a column selection circuit in the local bit line as illustrated in FIG. 6A has a lower discharge speed of the local bit line, resulting in a decrease in reading speed.

Figure 6B:
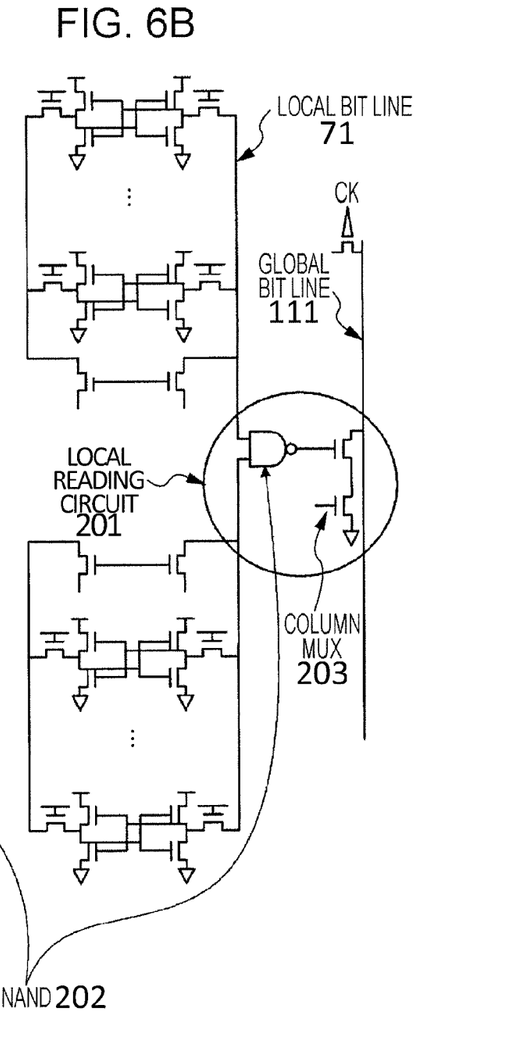
Figure 7:
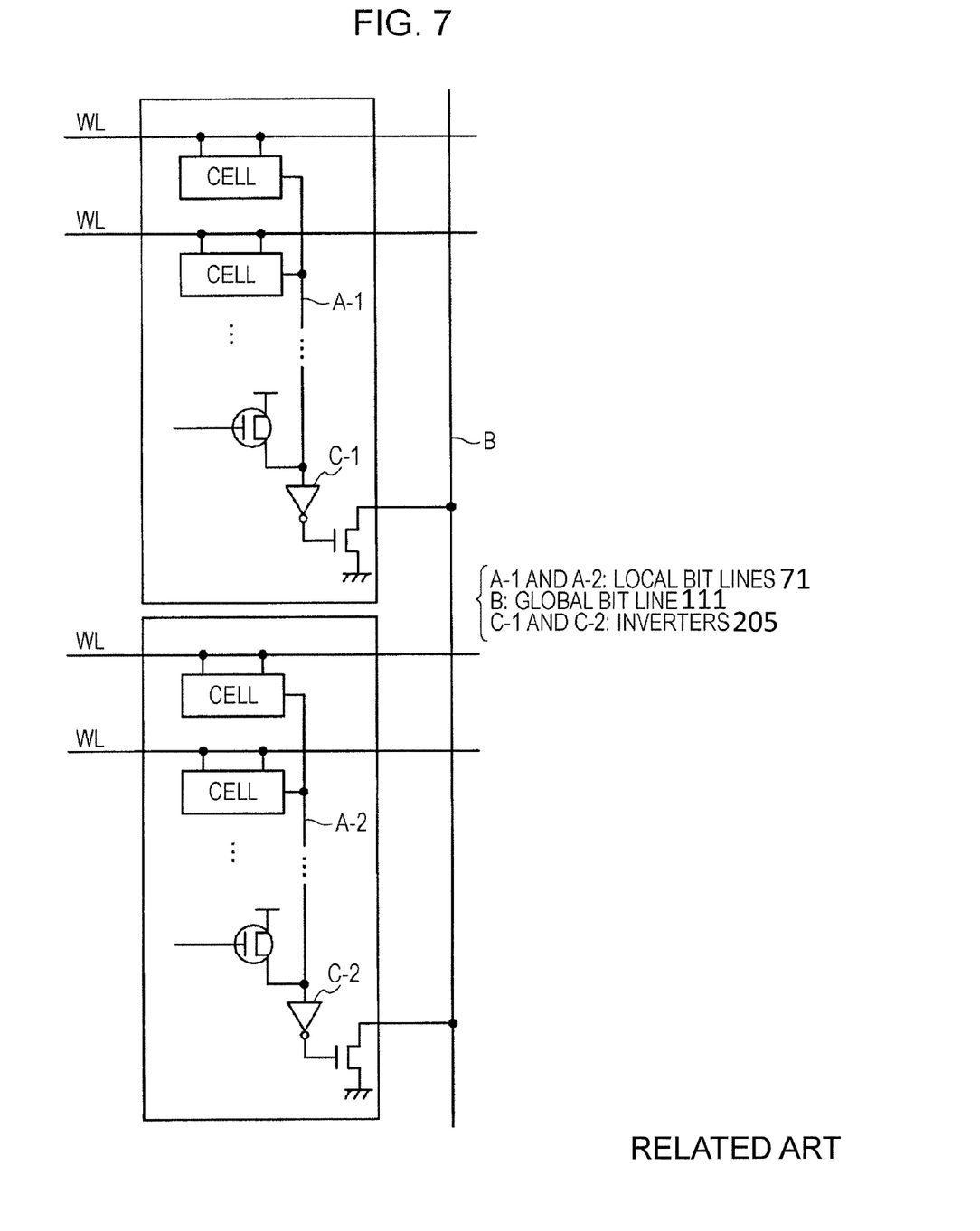
FIG. 7 is a diagram of circuit configuration in the past.

As illustrated in FIGS. 6A and 6B and FIG. 7, a CELL (a memory cell) is selected by the WL (word line) and the local bit line 71, and the addition of a local readinq circuit 201 configured by two or more transistors such as an inverter 205, column mux 204 and a NAND 202 to the end of the local bit line 71 may reduce the discharge speed of the local bit line. As a result, the reading speed of the semiconductor memory circuit may decrease.

As illustrated in FIG. 6A and FIG. 6B, the column selection in global reading instead of column selection in local reading using a local read circuit 201 (hereinafter also referred to as "local region") may possibly include charging/discharging with column mux 203 in the global bit line 111 for all columns, which may increase the power consumption. The local read circuit 201 includes MUX AND "L2" OUTPUT LATCH, and "LS" LATCH.

Figure 8:
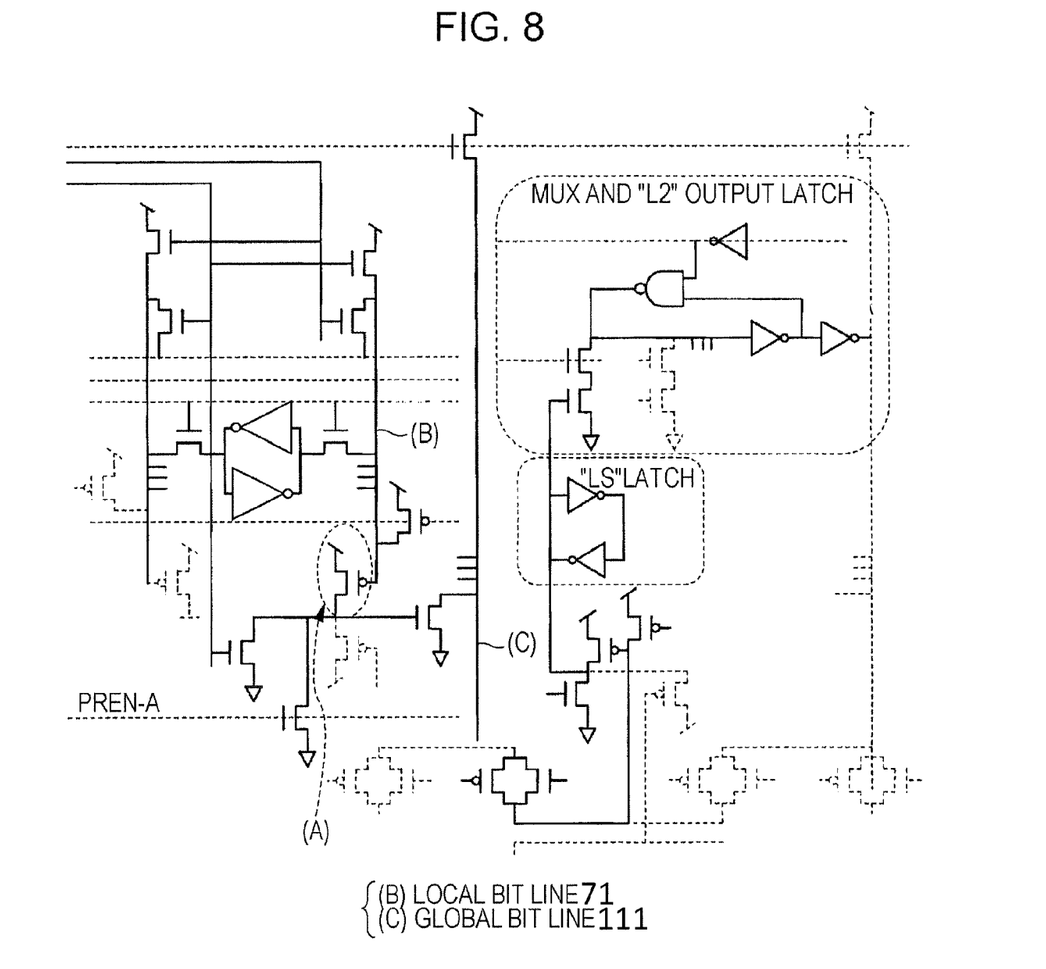
FIG. 8 is a diagram of circuit configuration in the past.

In FIG. 8, the reading speed is increased by a pre-discharge dynamic circuit having the end of the local bit line 71 connecting to one p-type transistor. (Refer to (A) in FIG. 8). However, since, as described above, the column selection is not performed in the local region, the power consumption disadvantageously increases. For example, the addition of a column selection circuit to the circuit illustrated in FIG. 8 may also necessarily increase the number of transistors. Both of a pre-discharge signal (PREN-A) and column selection signal may be required to input to the local region, which may also require the wiring area there for. For these reasons, building the column selection circuit into the circuit illustrated in FIG. 8 increases the size of circuit. FIGS. 6A and 6B to FIG. 8 are diagrams of circuit configurations in the past.

SUMMARY

According to an aspect of embodiments, a semiconductor memory device includes a first memory circuits connecting to a first bit line, a second bit line and a word line, a first pre-charge control circuit connecting to a first pre-charge control line, the first bit line and the second bit line and that pre-charges the first bit line and the second bit line on the basis of the input from the first pre-charge control line, and a read control circuit having a first transistor, a second transistor, a third transistor and a fourth transistor, wherein the fourth transistor is brought into conduction on the basis of the input from a charged global-bit-line driver control line, the column having the first bit line and the second bit line is thus selected, and the information held in the memory circuit connecting to the driven word line among the memory circuits is output to the third bit line.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A semiconductor memory circuit and a control method for reading data according to an embodiment will be described in detail below.

A semiconductor memory circuit according to a first embodiment includes a read circuit, which is a dynamic circuit having a bit line connecting to a single p-type transistor. There are two essential features of the semiconductor memory circuit according to the first embodiment. The first feature is that the read circuit includes a p-type transistor that is located in series between another p-type transistor connecting to the bit line and a power supply and is connected to a read-column selection line. The second feature is that the read circuit further includes an n-type transistor connecting to a read-column selection line. The semiconductor memory circuit according to the first embodiment will be described more specifically below.

Figure 1:
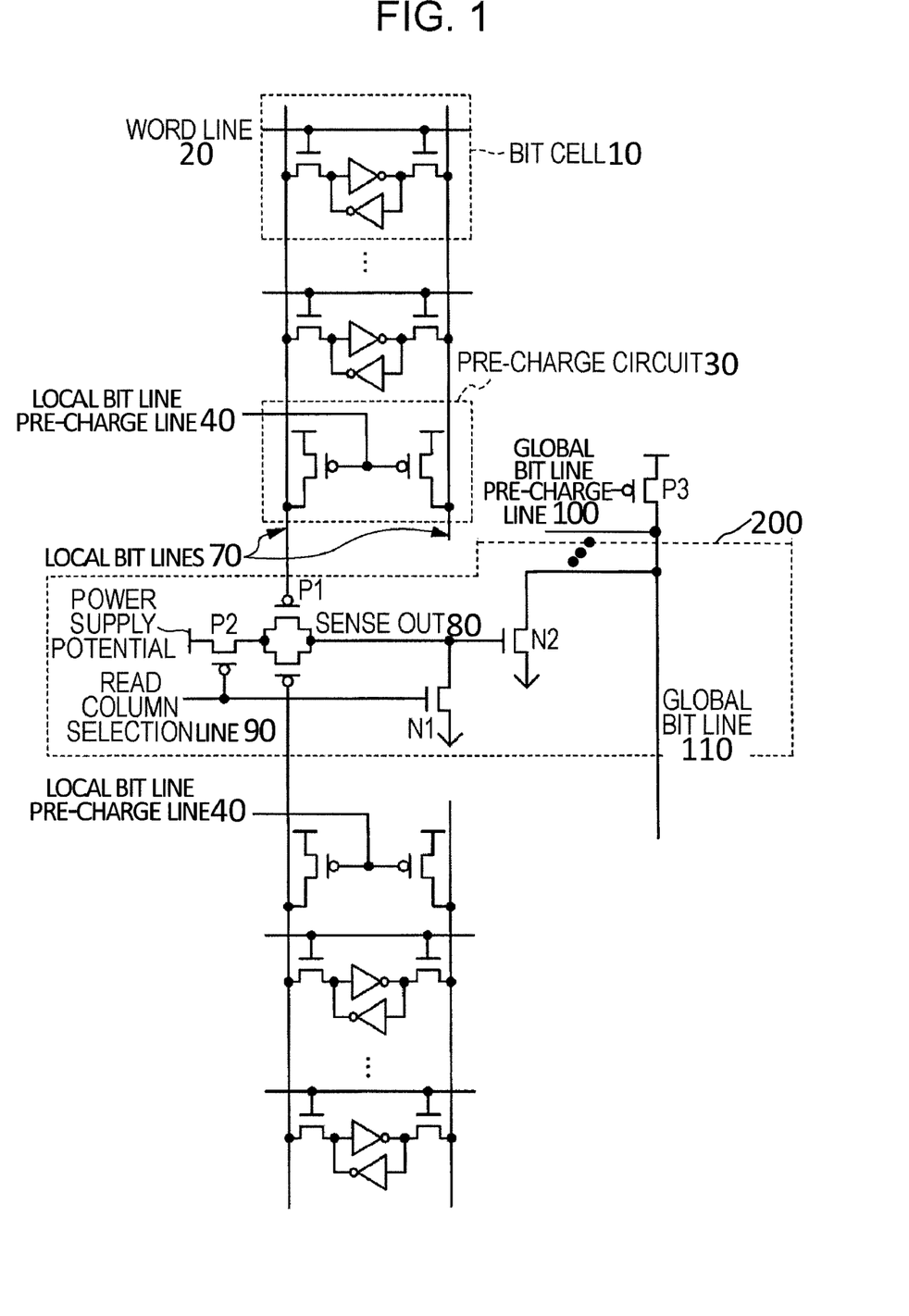
FIG. 1 is a diagram illustrating a circuit configuration of a semiconductor memory circuit according to a first embodiment.
Figure 2:
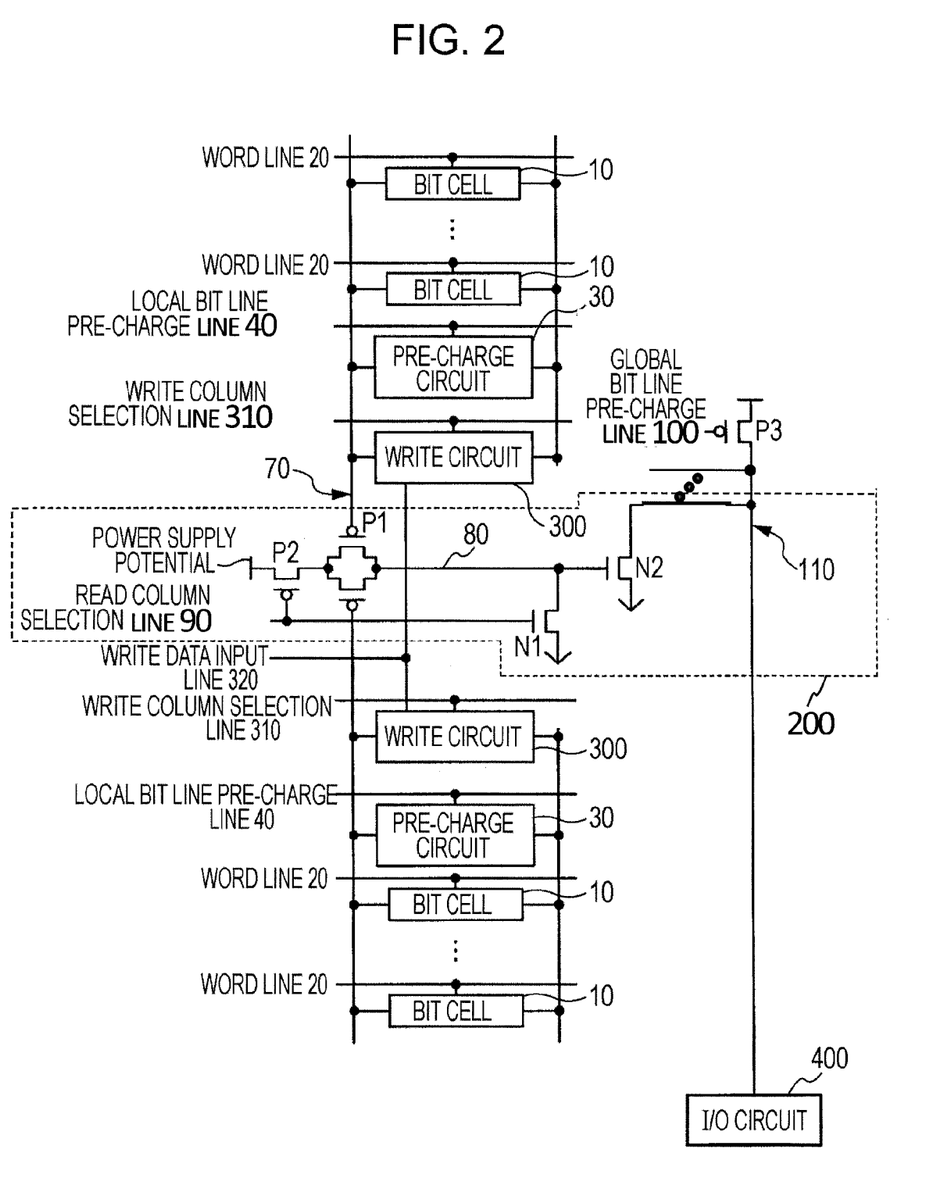
FIG. 2 is a diagram for explaining the semiconductor memory circuit according to the first embodiment.

FIG. 1 is a diagram illustrating a circuit configuration of the semiconductor memory circuit according to the first embodiment. FIG. 2 is a diagram for explaining the semiconductor memory circuit according to the first embodiment. This semiconductor memory circuit has a circuit configuration as illustrated in FIG. 1. With reference to FIG. 2, this semiconductor memory circuit will be described below.

As illustrated in FIG. 2, the semiconductor memory circuit according to the first embodiment includes a plurality of bit cells 10 that connect to local bit lines 70 and word lines 20 and hold information.

The semiconductor memory circuit further includes a pre-charge circuit 30 that connects to a local bit line pre-charge line 40 and the local bit lines 70 and pre-charges the local bit lines 70 on the basis of the input from the local bit line pre-charge line 40.

The semiconductor memory circuit further includes a read circuit 200 as will be described below. That is, the read circuit 200 has a p-type transistor P2 having a source terminal connected to a power supply and a gate terminal connected to a read-column selection line 90.

The read circuit 200 further has a p-type transistor P1 that has a source terminal connected to the drain terminal of the p-type transistor P2, a gate terminal connected to one of the local bit lines, and a drain terminal connected to a sense out line 80 and, on the basis of the input from the read-column selection line 90 and the potential level of the local bit line 70, charges the sense out line 80. The read circuit 200 further has an n-type transistor N1 that has a drain terminal connected to the sense out line 80, a gate terminal connected to the read-column selection line 90 and a source terminal grounded and pre-discharges the global-bit-line driver control line on the basis of a column selection signal. The read circuit 200 further has an n-type transistor N2 that has a drain terminal connected to a global bit line, a gate terminal connected to the sense out line 80 and a source terminal grounded.

In the read circuit 200, on the basis of the input from the charged sense out line 80, the n-type transistor N2 is brought into conduction. Thus, the column having the corresponding local bit line is selected (which means that when the signal on the read-column selection line 90 is changed to "Lo", the corresponding column is selected thereby), and the information held in the bit cell 10 having the word line 20 driven among the plurality of bit cells 10 is read from a global bit line 110.

The semiconductor memory circuit according to the first embodiment further includes, as illustrated in FIG. 2, a write circuit 300 connecting to a write-column-selection line 310 and a write data input line 320. On the basis of the input from the write-column-selection line 310, the column having the corresponding local bit line is selected, and the data is written from the write data input line 320 to the bit cell 10 having the word line 20 driven among the plurality of bit cells 10.

According to an embodiment, the bit cell 10 may also be referred to as "bit cell"; the word line 20 may also be referred to as "word line"; the pre-charge circuit 30 may also be referred to as "first pre-charge control circuit"; the local bit line pre-charge line 40 may also be referred to as "first pre-charge control line"; the local bit line 70 may also be referred to as "first bit line" or "second bit line"; the sense out line 80 may also be referred to as "global-bit-line driver control line"; the read-column selection line 90 may also be referred to as "column selection line"; the global bit line pre-charge line 100 may also be referred to as "third pre-charge control line," and the global bit line 110 may also be referred to as "third bit line."

According to an embodiment, the p-type transistor P1 may also be referred to as "second transistor"; the p-type transistor P2 may also be referred to as "first transistor"; the n-type transistor N1 may also be referred to as "third transistor," and the n-type transistor N2 may also be referred to as "fourth transistor."

According to an embodiment, the write circuit 300 may also be referred to as "writing control circuit"; the write-column-selection line 310 may also be referred to as "write-column-selection line," and the write data input line 320 may also be referred to as "write data input line."

Figure 3:
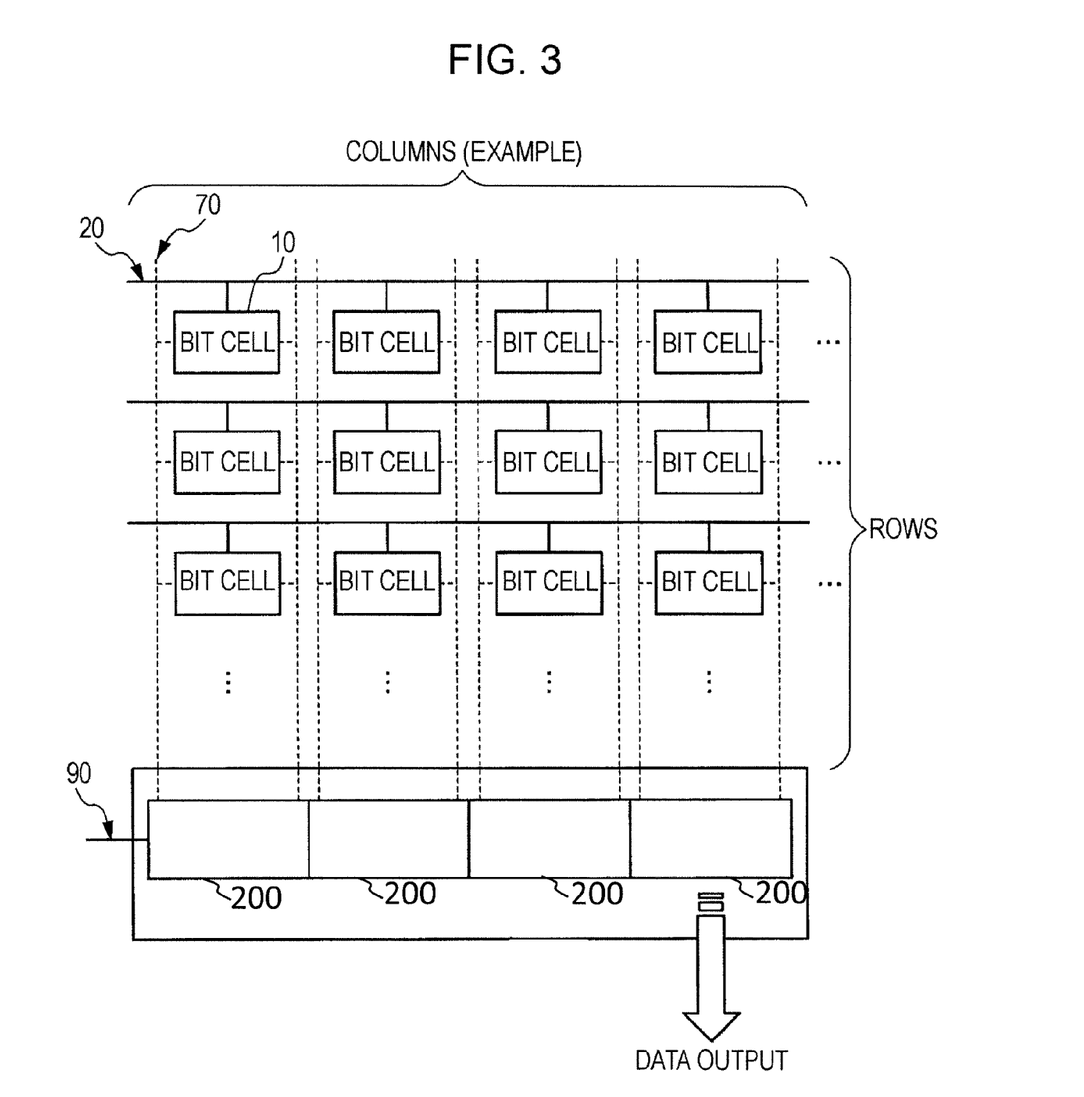
FIG. 3 is a diagram for explaining the semiconductor memory circuit according to the first embodiment.

With reference to FIG. 3, a bit-cell selecting method in the read circuit 200 will be described below. FIG. 3 is a diagram for explaining the semiconductor memory circuit according to the first embodiment. FIG. 1 and FIG. 2 illustrate only a single line of the bit cells 10, for simplification. Generally, as illustrated in FIG. 3, the plurality of bit cells is arranged in a semiconductor memory circuit.

For example, in response to a read request from a host, not depicted, the bit cell 10 holding the data corresponding to the read request in the read circuit 200 is selected. More specifically, as illustrated in FIG. 3, the word line 20 is driven, and the row connecting to the bit cell 10 holding the data corresponding to the read request is selected thereby. Then, on the basis of the input from the read-column selection line 90, the column connecting to the bit cell holding the data corresponding to the read request is selected.

Figure 4:
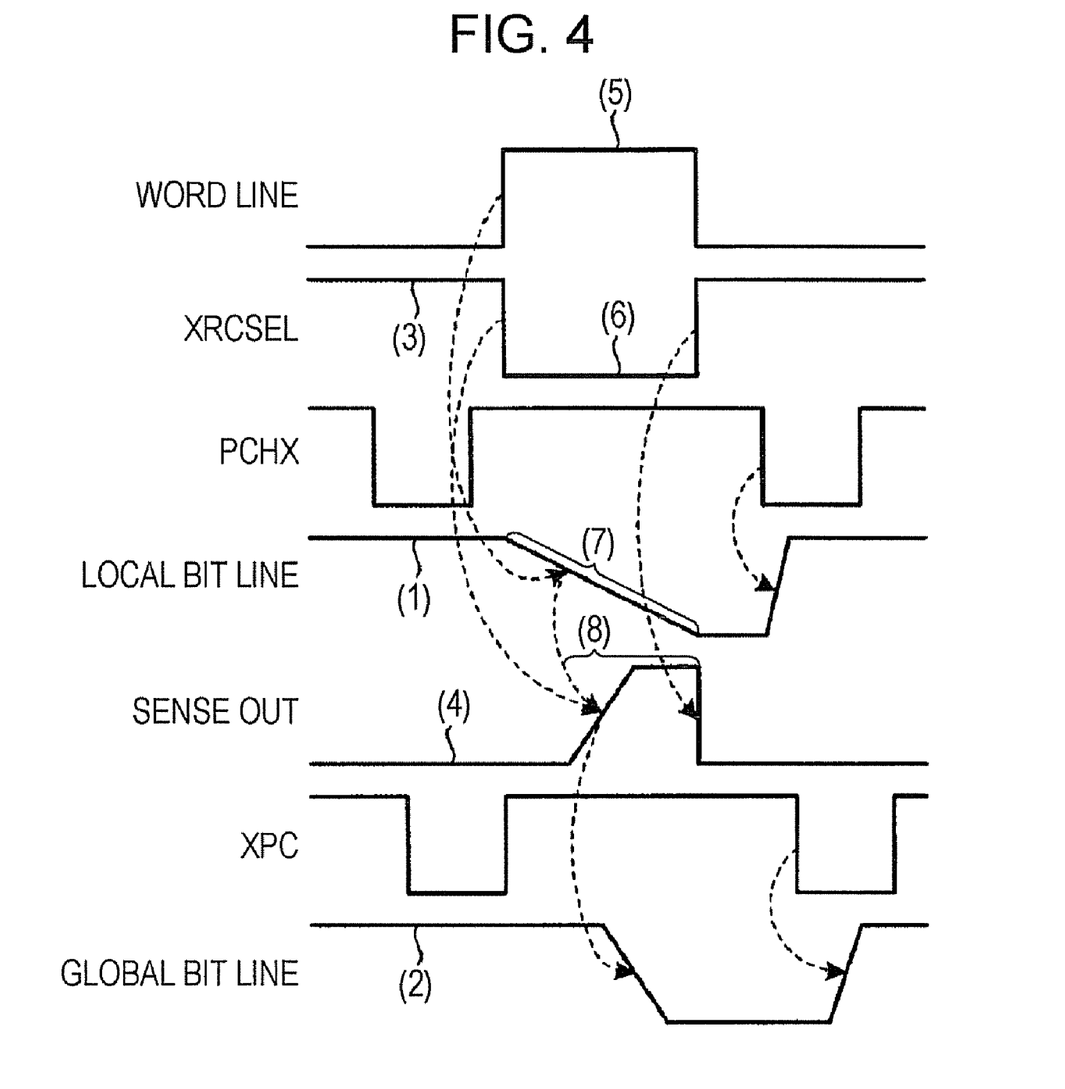
FIG. 4 is a diagram illustrating signal waveforms according to the first embodiment.

Next, with reference to FIG. 4, a reading operation routine in the read circuit 200 will be described. FIG. 4 is a diagram illustrating signal waveforms according to the first embodiment. The illustrated dashed arrow indicates signals that trigger the switching between "Hi" and "Lo" of the signals. In response to a read request and then on the basis of the input from the local bit line pre-charge line 40 (PCHX), the local bit line 70 is pre-charged. (Refer to (1) in FIG. 4). Next, on the basis of the input from the global bit line pre-charge line 100 (XPC), the global bit line 110 is pre-charged. (Refer to (2) in FIG. 4).

As illustrated in FIG. 4, during the pre-charge on the local bit line 70 and global bit line 110, the input from the read-column selection line 90 has "Hi". (Refer to (3) in FIG. 4). Thus, the n-type transistor N1 connected to the read-column selection line 90 is turned on, and the sense out line 80 is pre-discharged. As a result, the sense out line 80 is "Lo". (Refer to (4) in FIG. 4).

Then, the word line 20 is "Hi". (Refer to (5) in FIG. 4). When the input from the read-column selection line 90 (XRCSEL) is "Lo" (as in (6) in FIG. 4), the n-type transistor N1 is turned off. Since the input from the read-column selection line 90 has been changed to have "Lo", the corresponding column has already been selected. On the other hand, when the input from the read-column selection line 90 is "Lo" (as in (6) in FIG. 4), the p-type transistor P2 is turned on. Conversely, when the word line 20 is "Hi", the local bit line 70 is discharged (which means that, when the internal node of the bit cell relating to the local bit line 70 is "Lo", the local bit line 70 is discharged, and when it is "Hi", the local bit line 70 is not discharged). (Refer to (7) in FIG. 4). Thus, the p-type transistor P1 is turned on. When both of the p-type transistors P1 and P2 are turned on, charges are thus loaded from the power supply, and the sense out line 80 is charged. (Refer to (8) in FIG. 4).

The sense out line 80 having "Hi" turns on the n-type transistor N2. Thus, the global bit line 110 is discharged to "Lo". After the global bit line 110 is discharged, "Lo" is output to the I/O circuit 400 as the reading result from the bit cell 10.

The reading operation in the read circuit 200 will be organized conceptually. (1): The entire row driven by a word line is read. (2): In the row, the column required by a read-column selection signal is only selected (where the column has been already selected at that time). (3): As a result, the sense out is charged. (4): The sense out charged in (3) turns on the n-type transistor N2, and, as a result, the data in the memory/holding circuit selected by the word line and read-column selection signal is read (where the n-type transistor N2 is a circuit for transmitting the result read in the local region to the global region).

As described above, since the semiconductor memory circuit according to the first embodiment includes the read circuit having a dynamic configuration connecting a bit line to the p-type transistor P1, the speed of discharging from the local bit line 70 may be increased. As a result, the reading speed by the read circuit 200 may be increased.

A semiconductor memory circuit in the past has shorter local bit lines as a measure against the variations among the performance for manufacturing transistors. However, the increase in number of divisions of bit lines increases the size of the layout in the direction of the bit lines. Thus, the amount of amount of charges charge to be loaded or unloaded to or from a global bit line increases. As a result, the power consumption increases. On the other hand, the semiconductor memory circuit according to the first embodiment includes the read circuit internally having the p-type transistor P2 connected in series to between a p-type transistor P1 connected to the local bit line 70 and the power supply and connecting to the read-column selection signal. Since the p-type transistor P2 may implement the column selection of a bit cell, the number of global bit line to be charged or discharged may be reduced. As a result, the power consumption may be reduced.

Within the read circuit 200, the n-type transistor N1 for pre-discharging the sense out line 80 is connected to a read-column selection signal. Thus, one signal line may be required for column selection and pre-discharging the sense out line 80. Thus, the size of the circuit may be reduced.

A semiconductor memory circuit and a control method for writing/reading data according to another embodiment will be described below.

Figure 5:
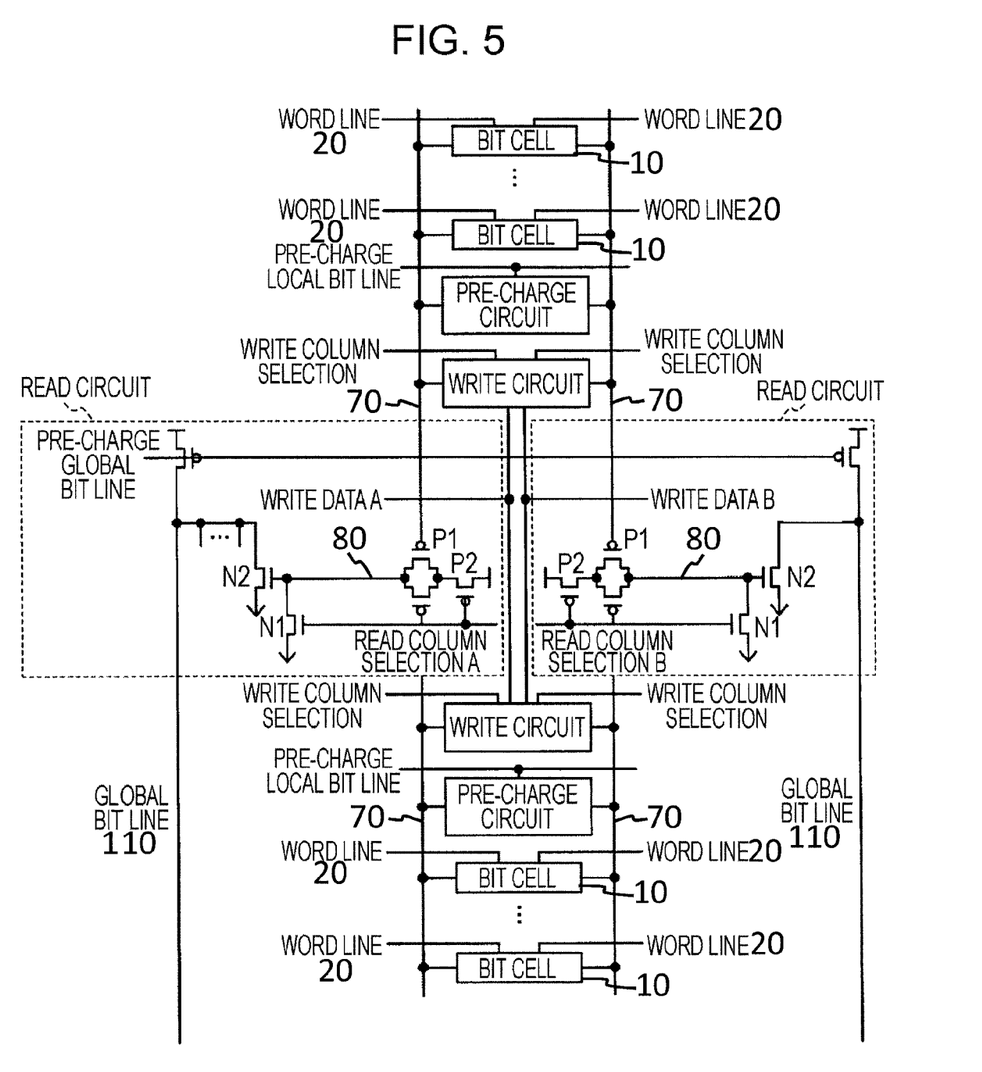
FIG. 5 is a diagram illustrating a circuit configuration of a semiconductor memory circuit according to a second embodiment.

[1] Application Example of Semiconductor Memory Circuit According to First Embodiment For example, as illustrated in FIG. 5, the semiconductor memory circuit according to the first embodiment is applicable to a multiport semiconductor memory circuit. FIG. 5 is a diagram illustrating a configuration of a semiconductor memory circuit according to the second embodiment.

As shown in FIG. 5, the circuit configuration of a semiconductor memory circuit includes a read circuit that has a p-type transistor P1 connected to the drain terminal of a p-type transistor P2, and a drain terminal connected to a sense out line 80, where a potential level of the local bit line 70, charges the sense out line 80. The read circuit 200 includes n-type transistors N1 and N2. According to an embodiment shown in FIG. 5, n-type type transistors N2 are configured to have a drain terminal connected to a global bit line. FIG. 5 shows n-type type transistors N1 that have a drain terminal connected to the sense out line 80.

[2] Circuit Configuration and Others

The components of the semiconductor memory circuit illustrated in FIG. 1 are not always physically required to be arranged as in the illustrated configuration. In other words, the concrete forms of the distribution and integration of the components of the semiconductor memory circuit illustrated in FIG. 1 are not limited to the illustrated one, but all or a part of the components may be functionally or physically distributed and/or integrated in arbitrary units in accordance with the loads and/or the usages, within the range required for achieving the object of the embodiment.

[3] Control Method for Reading Data

The semiconductor memory circuit according to the first embodiment may implement the control method for reading data as follows:

There may be provided a control method for reading data in the semiconductor memory circuit, the method including a reading control step of performing reading control including, on the basis of the input from the pre-charged sense out line 80, bringing the n-type transistor N2 into conduction, selecting the column having the corresponding local bit line 70, and outputting the information held in the bit cell 10 having the word line 20 driven among the plurality of bit cells 10 to the global bit line 110.

The semiconductor memory circuit in FIG. 5 includes Write column selection, Write data A, Write data B, Read column selection A, read column selection B.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor memory device comprising:
   a first plurality of memory circuits that connect to a first bit line, a second bit line, and a word line, and that hold information;
   a first pre-charge control circuit that connects to a first pre-charge control line, the first bit line, and the second bit line and that pre-charges the first bit line and the second bit line based on an input from the first pre-charge control line; and
   a read control circuit having a first transistor that has a source terminal connected to a power supply and a gate terminal connected to a read-column selection line;
   a second transistor that has a source terminal connected to a drain terminal of the first transistor, a gate terminal connected to the first bit line, and a drain terminal connected to a global-bit-line driver control line and that charges the global-bit-line driver control line based on an input from the read-column selection line and a potential level of the first bit line;
   a third transistor that has a drain terminal connected to the global-bit-line driver control line, a gate terminal connected to the read-column selection line, and a source terminal grounded and that pre-discharges the global-bit-line driver control line based on a column selection signal; and a fourth transistor that has a drain terminal connected to a third bit line, a gate terminal connected to the global-bit-line driver control line, and a source terminal grounded, and wherein the fourth transistor is brought into conduction based on an input from the charged global-bit-line driver control line, a column having the first bit line and the second bit line is thus selected, and the information held in a memory circuit connecting to a driven word line among the first plurality of memory circuits is output to the third bit line.

2. The semiconductor memory device according to claim 1, further comprising:

a second plurality of memory circuits that connect to a fourth bit line, a fifth bit line, and a word line and that hold information;

a second pre-charge control circuit that connects to a second pre-charge control line, the fourth bit line, and the fifth bit line and that pre-charges the fourth bit line and the fifth bit line based on an input from the second pre-charge control line; and a fifth transistor that has a source terminal connected to the drain terminal of the first transistor, a gate terminal connected to the fourth bit line, and a drain terminal connected to the global-bit-line driver control line and that charges the global-bit-line driver control line based on the input from the read-column selection line and a potential level of the fourth bit line.

3. The semiconductor memory device according to claim 1, further comprising:

a fifth transistor that has a source terminal connected to the power supply, a gate terminal connected to a third pre-charge control line, and a source terminal connected to the third bit line, wherein the third bit line is pre-charged based on an input from the third pre-charge control line.

4. The semiconductor memory device according to claim 2, further comprising:

a sixth transistor that has a source terminal connected to the power supply, a gate terminal connected to a third pre-charge control line, and a source terminal connected to the third bit line, wherein the third bit line is pre-charged based on an input from the third pre-charge control line.

5. The semiconductor memory device according to claim 1, further comprising:

a control circuit that writes data connecting to a write-column-selection line and a write data input line, wherein:

a column having the second bit line and the first bit line is selected based on an input from the write-column-selection line, and write data from the write data input line is written to a memory circuit connecting to the driven word line among the first plurality of memory circuits and a second plurality of memory circuits.

6. The semiconductor memory device according to claim 2, comprising:

a control circuit that writes data connecting to a write-column-selection line and a write data input line, wherein:

a column having the second bit line and the first bit line is selected based on an input from the write-column-selection line, and write data from the write data input line is written to a memory circuit connecting to the driven word line among the first plurality of memory circuits and the second plurality of memory circuits.

7. A control method for reading data in a semiconductor memory device, the semiconductor memory device having:

a first plurality of memory circuits that connect to a first bit line, a second bit line, and a word line and that hold information;

a first pre-charge control circuit that connects to a first pre-charge control line, the first bit line, and the second bit line and that pre-charges the first bit line and the second bit line based on an input from the first pre-charge control line; and a read control circuit having a first transistor that has a source terminal connected to a power supply and a gate terminal connected to a read-column selection line, a second transistor that has a source terminal connected to a drain terminal of the first transistor, a gate terminal connected to the first bit line, and a drain terminal connected to a global-bit-line driver control line and that charges the global-bit-line driver control line based on an input from the read-column selection line and a potential level of the first bit line; a third transistor that has a drain terminal connected to the global-bit-line driver control line, a gate terminal connected to the read-column selection line, and a source terminal grounded and that pre-discharges the global-bit-line driver control line based on a column selection signal; and a fourth transistor that has a drain terminal connected to a third bit line, a gate terminal connected to the global-bit-line driver control line, and a source terminal grounded, the control method for reading data comprising:

selecting a column having the first bit line and the second bit line, by bringing the fourth transistor into conduction based on an input from the charged global-bit-line driver control line; and outputting the information held in a memory circuit connecting to a driven word line among the first plurality of memory circuits to the third bit line.

* * * * *